(12) United States Patent
Koh et al.

(10) Patent No.: US 7,781,873 B2
(45) Date of Patent: Aug. 24, 2010

(54) ENCAPSULATED LEADFRAME SEMICONDUCTOR PACKAGE FOR RANDOM ACCESS MEMORY INTEGRATED CIRCUITS

(75) Inventors: Wei H. Koh, Irvine, CA (US); Fred Kong, Irvine, CA (US); David Chen, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 333 days.

(21) Appl. No.: 10/424,096

(22) Filed: Apr. 28, 2003

(65) Prior Publication Data

US 2004/0212053 A1    Oct. 28, 2004

(51) Int. Cl.
*H01L 23/495* (2006.01)
*H01L 23/48* (2006.01)

(52) U.S. Cl. .................. 257/673; 257/666; 257/676; 257/690; 257/692; 257/695; 257/737

(58) Field of Classification Search ............... 257/666, 257/669, 670, 672, 673, 676, 690, 692–696, 257/787, 737–738; 438/123–127
See application file for complete search history.

(56) References Cited

U.S. PATENT DOCUMENTS

| | | | | |
|---|---|---|---|---|
| 5,083,191 A | * | 1/1992 | Ueda ........................... | 257/783 |
| 5,239,198 A | * | 8/1993 | Lin et al. ..................... | 257/693 |
| 5,250,841 A | * | 10/1993 | Sloan et al. ................. | 257/666 |
| H1267 H | * | 12/1993 | Boyd .......................... | 257/666 |
| 5,367,253 A | * | 11/1994 | Wood et al. ............... | 324/158.1 |
| 5,369,545 A | * | 11/1994 | Bhattacharyya et al. .. | 361/306.2 |
| 5,437,915 A | * | 8/1995 | Nishimura et al. .......... | 428/209 |
| 5,442,231 A | * | 8/1995 | Miyamoto et al. .......... | 257/668 |
| 5,471,369 A | * | 11/1995 | Honda et al. ................ | 361/813 |
| 5,594,626 A | * | 1/1997 | Rostoker et al. ............ | 361/784 |
| 5,677,567 A | * | 10/1997 | Ma et al. ..................... | 257/666 |
| 5,763,952 A | * | 6/1998 | Lynch et al. ................. | 257/735 |
| 5,777,386 A | * | 7/1998 | Higashi et al. .............. | 257/737 |
| 5,790,378 A | * | 8/1998 | Chillara ...................... | 361/719 |
| 5,917,242 A | * | 6/1999 | Ball .......................... | 257/737 |
| 6,002,167 A | * | 12/1999 | Hatano et al. ............... | 257/696 |
| 6,087,718 A | * | 7/2000 | Cho ............................ | 257/686 |
| 6,093,958 A | * | 7/2000 | Inaba ......................... | 257/672 |
| 6,169,328 B1 | * | 1/2001 | Mitchell et al. ............. | 257/778 |
| 6,211,576 B1 | * | 4/2001 | Shimizu et al. ............. | 257/786 |
| 6,229,202 B1 | * | 5/2001 | Corisis ....................... | 257/666 |
| 6,232,213 B1 | * | 5/2001 | King et al. .................. | 438/613 |

(Continued)

*Primary Examiner*—Ori Nadav
(74) *Attorney, Agent, or Firm*—Morland C. Fischer

(57) ABSTRACT

A thin, small outline IC leadframe plastic package to be used to assemble high performance, high speed semiconductor memory IC devices such as dynamic random access memories (DRAM) having a high data transfer rate in the range of 1 GigaHertz. The package leadframe is electrically interconnected to the IC device input-output pads by either electrically conductive (e.g. solder) bumps that are flip-chip bonded to the IC device or by of an interposer. The interposer contains integral curled micro-spring contacts at opposite ends of conductive fan out traces. The interposer is attached to the leadframe bonding pads by way of tape automated bonding, soldering, or adhesive bonding. The leadframe that is interconnected to the IC device by the aforementioned flip-chip bumps or the interposer is encapsulated and trimmed to form either gull-wing style perimeter leads as a standard thin small outline package (TSOP) or wrap around leads as a micro-leadframe (MLF) package.

16 Claims, 4 Drawing Sheets

U.S. PATENT DOCUMENTS

| | | | |
|---|---|---|---|
| 6,337,522 B1 * | 1/2002 | Kang et al. | 257/784 |
| 6,342,727 B1 * | 1/2002 | Fujimori | 257/668 |
| 6,440,772 B1 * | 8/2002 | Smith | 438/106 |
| 6,498,389 B1 * | 12/2002 | Kim | 257/673 |
| 6,640,415 B2 * | 11/2003 | Eslamy et al. | 29/593 |
| 6,724,074 B2 * | 4/2004 | Song et al. | 257/676 |
| 2003/0148108 A1 * | 8/2003 | Pierce | 428/413 |
| 2003/0218237 A1 * | 11/2003 | Hall et al. | 257/675 |
| 2004/0150082 A1 * | 8/2004 | Kajiwara et al. | 257/678 |

* cited by examiner

ENCAPSULATED LEADFRAME SEMICONDUCTOR PACKAGE FOR RANDOM ACCESS MEMORY INTEGRATED CIRCUITS

BACKGROUND OF THE INVENTION

1. Field of the Invention

This invention relates to plastic leadframe semiconductor packages such as those used in the manufacture of dynamic random access memories (DRAM) that are capable of a high data transfer rate in the range of 1 GigaHertz.

2. Background Art

Dynamic random access memory (DRAM) integrated circuits are widely used in leadframe packages such as thin small outline packages (TSOP) for memory module assembly. TSOP packages have many advantages in the fabrication of dual inline memory modules (DIMM). These packages are characterized by a low (i.e. thin) profile, low manufacturing cost, relatively small size, and are generally compatible with common surface mount technology (SMT) equipment and processes. Accordingly, in recent years, TSOP packages have been the package of choice for use in most DIMM memory module assemblies.

However, with the advent of high-speed and high-performance DRAM memory devices, the system clock speed of a synchronous DRAM (SDRAM) has increased from less than 100 MHz to over 300 MHz and higher. Newer generation devices such as the double data rate (DDR) SDRAM have clock speeds moving beyond 500 MHz. These high performance devices require that the package electrical inductance be minimized to better preserve the system signal integrity and timing parameters. Typically, a conventional TSOP package containing an IC chip is wire-bond interconnected to the leadframe tip bonding pads by means of thin (e.g. 25-30 µm diameter) gold wires. Hence, at high frequencies, such wirebond interconnections exhibit a significant amount of inductance.

Consequently, many chip scale packages (CSP) use ribbon conductors instead of wires to reduce the package inductance. However, the CSP packages are more expensive to manufacture than TSOP packages and require more advanced surface mount technology equipment for board-level assembly and inspection. Accordingly, there exists a need for a high performance TSOP-type leadframe package that can be manufactured at low cost and can be easily assembled using standard SMT equipment and procedure so as to be suitable for use in most DRAM packages used today.

In a modern memory IC TSOP package, the IC input/output bonding pads are located along the centerline of the chip and the leadframe leads are extended to both the right-hand and the left-hand sides of the center bonding pads. This lead-over chip (LOC) arrangement is employed to minimize the distance between the leadframe terminals and the bond pads such that, after wire bonding, the wire loop distance and height will be minimized when compared to having the leadframe terminals located near the perimeter of the chip, which requires much longer wire length from the center of the chip. Even with such LOC optimization, there still is a substantially large wire length in a TSOP package when compared to chip scale packages that use shorter interconnections by means of either thin wires, conductive ribbons, or flip chip bumps. Because of this limitation, new generations of SDRAMs having high system speeds are typically used in only the more expensive CSP packages.

It is therefore desirable to have a configuration compatible, low-cost package that permits the use of late generation, high-speed DDR SDRAM memory integrated circuits in leadframe packages such as a TSOP for easy manufacturability in a conventional memory DIMM module assembly. In this same regard, it is also desirable to enhance the high-speed performance characteristics by replacing the conventional thin wire bonds used for electrical interconnection between the IC input/output bonding pads and the package leadframe terminal pads with other interconnection means that allow for better electrical signal integrity and timing parameters similar to those of chip scale packages.

SUMMARY OF THE INVENTION

According to a first embodiment, a plastic leadframe semiconductor package includes an IC chip that has self-contained flip chip bumps, a leadframe segment to which the chip is attached, and a package body comprising a plastic molding compound to encapsulate the chip and the leadframe. The external leads of the leadframe can be formed into a gull-wing shape to resemble a standard thin small outline package (TSOP). Alternatively, the external leads of the leadframe can be wrapped around the bottom of the plastic body to resemble a micro-lead frame (MLF) package. Inside the molded body, the internal tips of the leadframe are flip chip bonded to bumps formed on the die by appropriate flip chip bonding methods. The original centerline bond pads on each IC are first re-routed by a redistribution layer on the surface of the chip. The ending locations of the fan-out pads are chosen to mate with the leadframe terminals. Appropriate wafer bumping techniques are then used to deposit the desired flip chip bumps onto the IC at the designated locations. The bumps are preferably formed from solder, gold, nickel/gold or conductive polymer.

As an alternate to the flip chip bump attachment method, the interconnection between the IC and the leadframe inner tips is made by means of an interposer. The interposer includes either a thin flexible substrate, such as that made from polyimide/copper, or a thin flexible core glass/epoxy printed wiring board. The center pads of the interposer are mated to the IC bonding pads by using raised micro-bumps such as gold stud bumps, conductive polymer bumps, or conductive particle filled polymer/composite bumps or by using oppositely curled microspring contacts having a spring-like flexibility. The fan out portion of the substrate in the interposer includes fan-out traces with terminal bonding pads. The interposer can be pre-attached to the IC by adhesive lamination or be attached to the leadframe by means of reflow soldering.

BRIEF DESCRIPTION OF THE DRAWINGS

FIG. 5b is an end view of the interposer of FIG. 5a;

DETAILED DESCRIPTION

Figure 1:
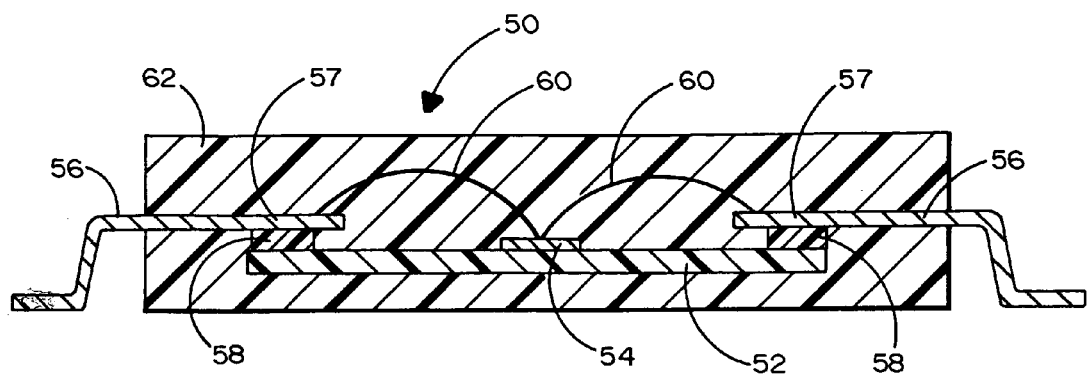
FIG. 1 shows a conventional semiconductor leadframe package that is characterized by a wire bond interconnection between the IC and the inner tips of the leadframe.

FIG. 1 of the drawings illustrates a conventional plastic leadframe semicondutor package 50 having a well known wire bond interconnect scheme. The semiconductor package 50 includes an integrated circuit (IC) device 52 having center bonding pads 54 (only one of which being shown) attached to the top surface thereof. The leadframe 56 is affixed to the top surface of IC device 52 by means of adhesive 58. The inner tips 57 of the leadframe 56 are electrically connected to the center bonding pads 54 by way of thin gold wires 60. The IC device 54, leadframe 56, and wire interconnects 60 are all encapsulated by a suitable molding (e.g. plastic) compound 62.

Figure 2:
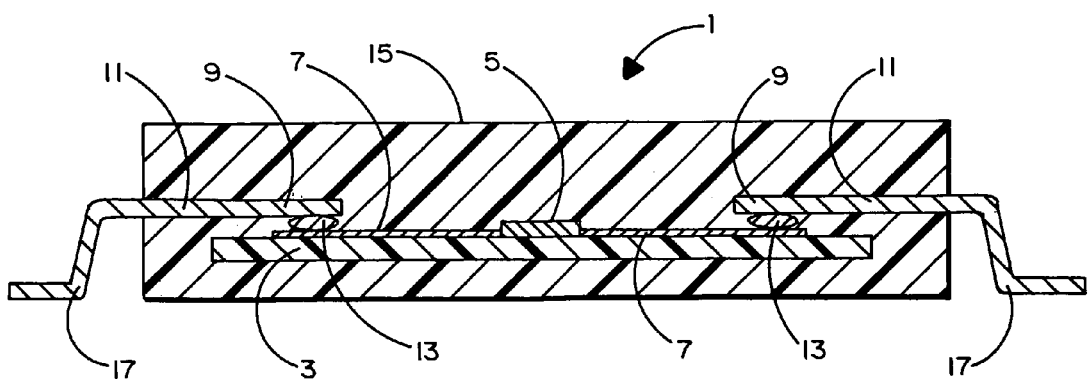
FIG. 2 shows the cross-section of a new TSOP semiconductor leadframe package with flip chip bump interconnection between the IC and the inner tips of the leadframe, where the outer lead frame tips have a gull-wing shape.

Referring to FIG. 2 of the drawings, the cross-section of a plastic leadframe semiconductor package 1 according to a first embodiment of this invention is shown having an IC device 3 with center input-output bonding pads 5 (only one of which is being shown). The center bonding pads 5 include conductive traces 7 to fan out the original input and output pads to both sides of IC device 3 at locations that match the inner tips 9 of the leadframe 11 with designated terminals for interconnection to the specific input and output pads. Pursuant to the improvement of this first embodiment, individual bumps 13 are fabricated on the surface of the IC device 3 at wafer level prior to dicing into individual chips. Such chip grown bumps 13 are often referred to as flip chip bumps. By way of a preferred example, the bumps 13 are formed of solder or any other conductive material that is suitable for interconnection to the leadframe terminals. The flip chip bumps 13 of FIG. 2 replace the wire bond interconnects 60 of FIG. 1.

During die-attach assembly, the IC device 3 is first aligned to the leadframe 11 and then the flip chip bumps 13 are interconnected using appropriate wafer bumping methods in accordance with the bump material. The inner tips 9 of the leadframe 11 are flip chip bonded to bumps 13 by conventional flip chip bonding methods. In the case where eutectic solder bumps are used, an oven reflow process is applied to join the solder bumps 13 to the leadframe tips. When conductive polymer bumps are used, appropriate compression and heat cure are applied to join the bumps 13 and the leadframe tips.

The attached die/leadframe subassembly is then encapsulated using a molding compound material 15. The external leads 17 of the leadframe 11 of package 1 are then trimmed and formed to be the desired shape. For the semiconductor package 1 of FIG. 1, the external lead tips 17 of leadframe 11 are formed into a gull-wing shape to resemble a standard thin small outline package (TSOP).

Figure 6:
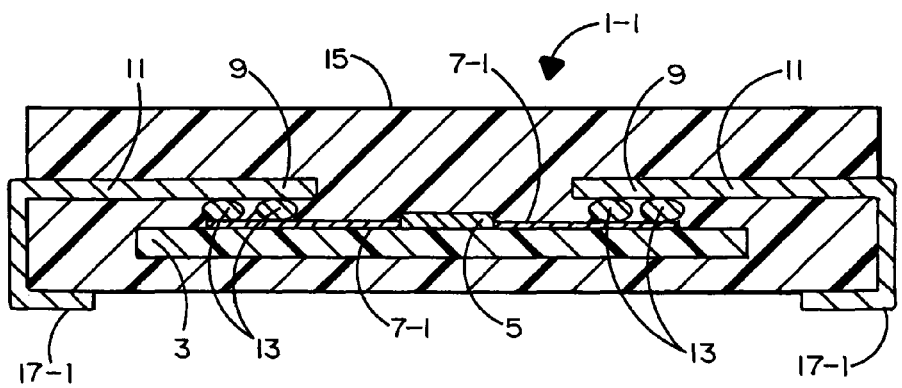
FIG. 6 is a cross-section of an MLF semiconductor package with flip chip bump interconnection between the IC and the inner tips of the leadframe, where the outer leadframe tips are wrapped underneath the plastic encapsulated body.

Turning briefly to FIG. 6 of the drawings, the cross-section of a plastic leadframe package 1-1 is shown which is substantially identical to the semiconductor package 1 of FIG. 2, except that the external lead tips 17-1 of the leadframe 11 of package 1-1 are wrapped around the bottom of the molding compound 15 within which the IC device 3 is encapsulated so as to resemble a micro-lead frame (MLF) package. In addition, the fan out traces 7-1 of package 1-1 are longer than the traces 7 of the package 1 of FIG. 2 so as to accommodate a plurality of flip chip bumps 13 by which to connect traces 7-1 to the inner tips 9 of leadframe 11, whereby to establish a redundant interconnect for the purpose of maximized reliability. The remaining reference numbers and structure used to illustrate the MLF package 1-1 of FIG. 6 are the same as those used to illustrate the TSOP package 1 of FIG. 2.

Figure 3:
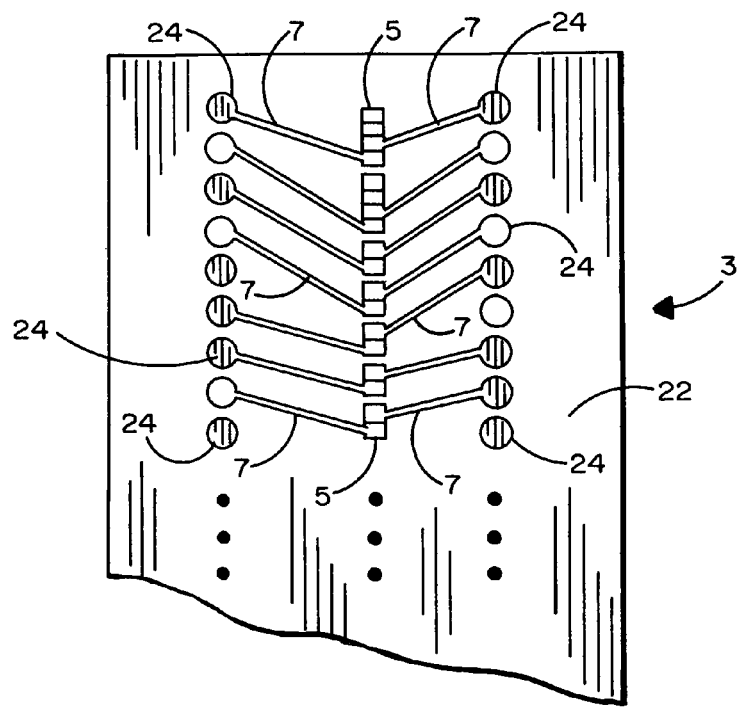
FIG. 3 shows the center bond pads and redistribution traces fanning out the flip chip bumps to two sides of the IC of the semiconductor leadframe package of FIG. 2.

The fan-out pattern for the IC device 3 of the semiconductor package 1 of FIG. 2 is illustrated in FIG. 3 of the drawings, where a redistribution layer 22 containing conductive traces 7 is applied to fan out or reroute the centerline bonding pads 5 of IC device 3 in opposite directions to trace terminal bump pads 24 disposed at the designated locations for mating with their respective leadframe inner tips (designated 9 in FIG. 2). Each of the conductive traces 7 is made with suitable width and length to control the line resistance values thereof. A suitable under bump metallization (UBM) deposition is applied to the bump pads 24 during the wafer redistribution layer fabrication process prior to wafer bumping. In the case where solder bumps (designated 13 in FIG. 2) are used, the solder is applied by either electroplating or screen printing followed by solder reflow. However, other materials can be used in place of solder to form the flip chip bumps 13, such as gold, nickel/gold, or conductive polymer. Depending upon the bump material and the flip chip attachment method, a plastic liquid underfill material may be required. However, it is preferable that the molding composite material 15 be sufficiently soft so that no underfill material will be needed during encapsulation of the plastic package 1.

By way of a particular example, for electroplated solder bumps, an under bump metallization comprising copper, nickel and gold is first applied to the bump pad area 24 to be followed by an electroplating of the tin/lead solder material. After electroplating, the solder material is reflowed in a reflow oven to form the round bumps 13.

Figure 4:
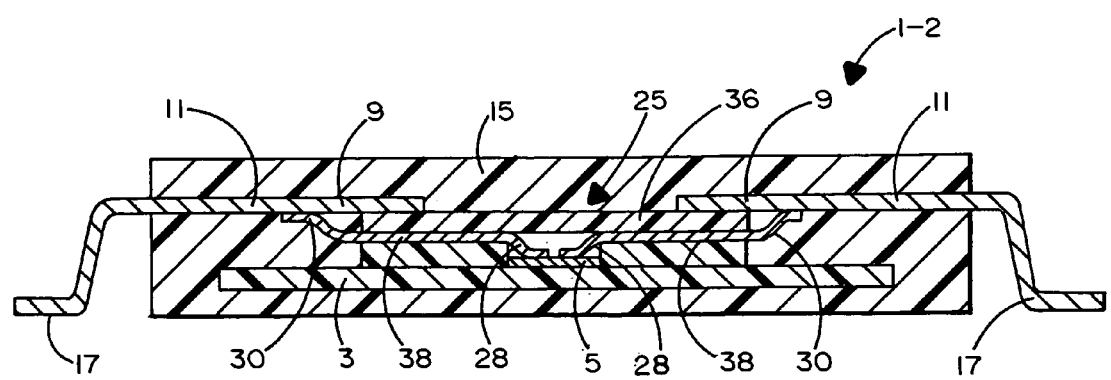
FIG. 4 shows a cross-section of a TSOP semiconductor leadframe package having an interposer with microspring contacts for interconnection between the IC chip and the leadframe inner tips.

Turning now to FIG. 4 of the drawings, there is illustrated the cross-section for a plastic leadframe package 1-2 that is similar to the package 1 of FIG. 2, except that an alternate means is provided of connecting the IC device 3 to the leadframe 11 at opposite sides of device 3. That is to say, instead of using flip chip bumps (designated 13 in FIG. 2), an interposer 25 is shown located inside the encapsulated package body 15 by which the IC device 3 is connected to the inner tips 9 of leadframe 11. The interposer 25 of FIG. 4 includes either a thin flexible substrate 36 such as polyimide/copper or liquid crystal polymer or a relatively rigid thin core glass/epoxy printed wiring board. In the case where the substrate 36 is flexible, the entire interposer 25 will have a flexible characteristic. The center pads of the interposer 25 are connected to opposite sides of the bonding pads 5 of IC device 3 by way of a pair of curled inner microspring contacts 28 that have a spring-like characteristic. Conductive traces 38 are interconnected between the inner microspring contacts 28 and the inner tips 9 of leadframe 11 by way of a pair of curled outer microspring contacts 30 that also have a spring-like characteristic. The inner pair of curled microspring contacts 28 that connect conductive traces 38 to IC bonding pad 5 are oriented to curve in a first direction, while the outer pair of curled microspring contacts 30 that connect traces 38 to leadframe tips 9 are oriented to curve in an opposite direction. The microspring contacts 28 and 30 are preferably manufactured from molybdenum or chrome by using physical vapor deposition (PVD) with precise stress control in the sputtered films to create contacts having the required curvature and spring-like flexibility.

Because the size of the IC bonding pads 5 is typically very small (e.g. less than 100×100 µm square), the interposer 25 must be able to support extremely fine pitch conductive traces 38 and microspring contacts 28 and 30. For the microspring contacts 28 and 30 used herein, a metallic trace smaller than 100 μm is photo-etched on a substrate base material such as polyamide, for example, and then treated and pre-stressed to cause it to curve so as to have a flexible, spring-like characteristic.

The semiconductor leadframe package 1-2 of FIG. 4 is shown having the external lead tips 17 of leadframe 11 bent to resemble the TSOP package 1 of FIG. 2. However, external lead tips 17 may also be bent to resemble the MLF package 1-1 of FIG. 6.

Figure 7:
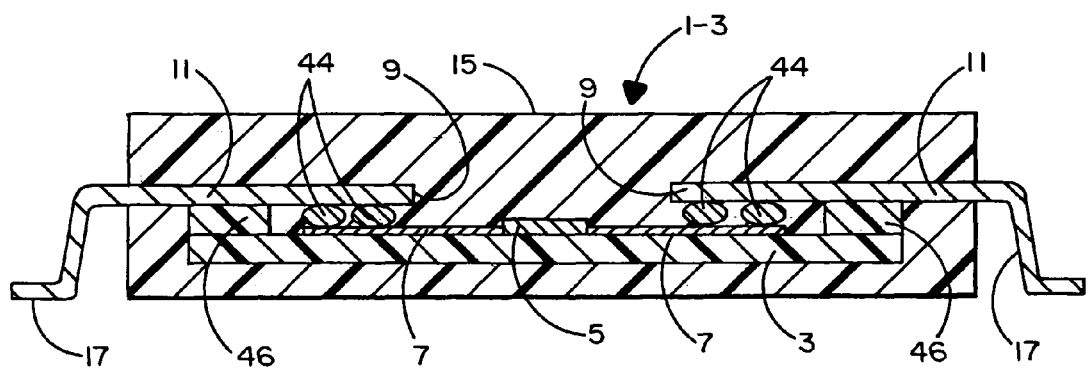
FIG. 7 shows an alternative embodiment for the interposer of the TSOP package of FIG. 4.

In place of the microspring contacts 28 and 30 of FIG. 4, FIG. 7 of the drawings shows a plastic leadframe package 1-3 having small gold stud bumps 44 by which to connect the IC bonding pads 5 to the internal tips 9 of leadframe 11 via conductive traces 7. The gold bumps 44 are generated from a gold wire ball bonder machine. Gold bumps 44 that are generated from a ball bonder machine typically have sizes around 50 μm, which is compatible with the size of typical DRAM IC center wire bond pads. The leadframe 11 of the package 1-3 of FIG. 7 is bonded to the surface of IC device 3 by means of optional adhesive patches 46 so that the inner leadframe tips 9 are properly aligned with respect to traces 7 with the gold bumps 44 located therebetween.

Another type of bump which is suitable for use herein are microdots of conductive polymer materials. Such polymer bumps can be formed by using an inkjet head or microdispensing syringes or pumps. Yet another bump material is a conductive particle filled polymer/composite.

Figure 5A:
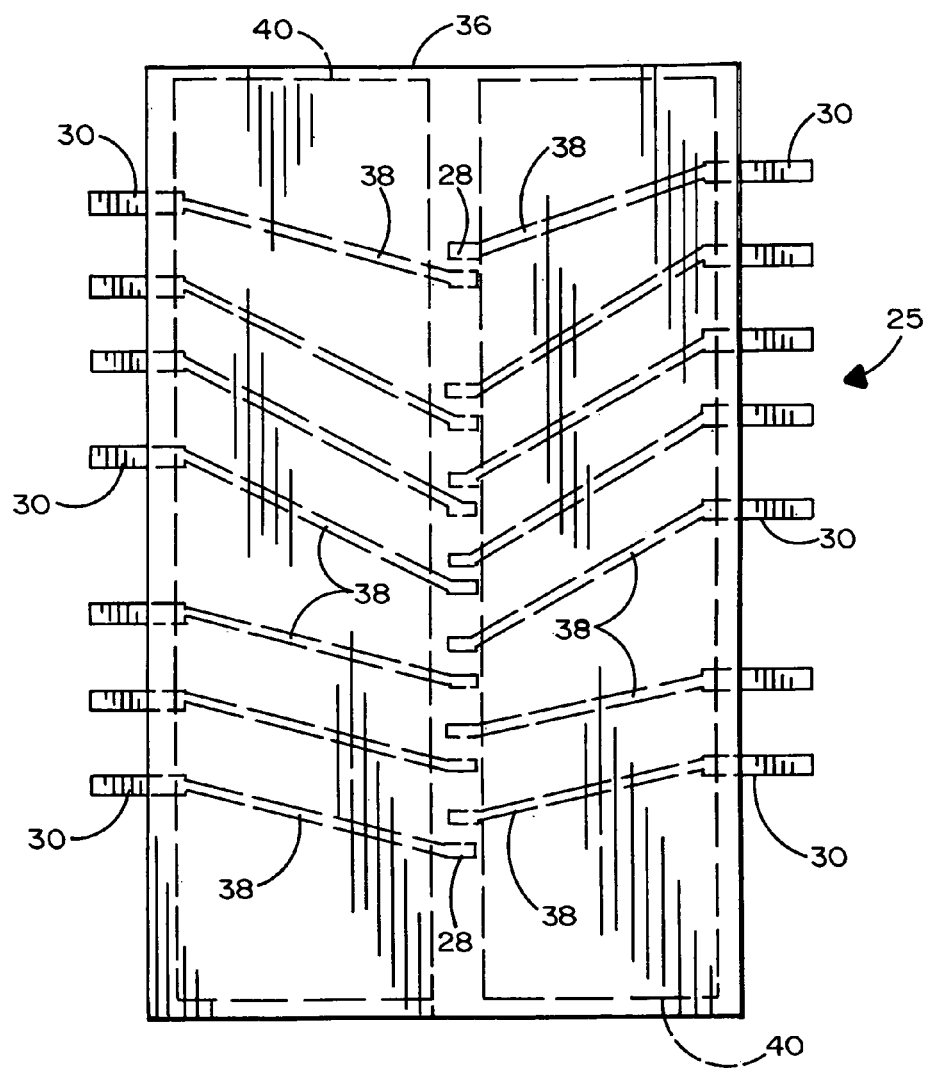
FIG. 5a is a top view showing details of the interposer and the microspring contacts thereof connected between the IC bonding pads and the leadframe tips of the package of FIG. 4.

FIG. 5a of the drawings illustrates a top view of the layout for the interposer 25 that is encapsulated within the leadframe package 1-2 of FIG. 4. As was earlier described when referring to FIG. 4, the interposer layout includes either a thin flexible substrate 36 or a more rigid circuit board made with laminated material such as glass epoxy. As was also earlier disclosed, in the case where substrate 36 is flexible, the interposer 25 will have a flexible characteristic. Alternatively, the substrate 36 can be a thin ceramic substrate made from aluminum oxide (alumina) or aluminum nitride. The conductive traces 38 extending between the pairs of inner and outer microspring contacts 28 and 30 are preferably PVD thin film paths that are formed by sputtering and etching. By controlling the intrinsic tensile stress and compressive stress in the thin film metal composition, the microspring contacts 28 and 30 can be suitably curved once the covering passivation layer 40 (e.g. polyamide or BCB) over substrate 36 is removed. In particular, the internal tensile stress of the inner springs 28 and outer springs 30 is opposite such that the contacts are curved in opposite directions.

Figure 5B:
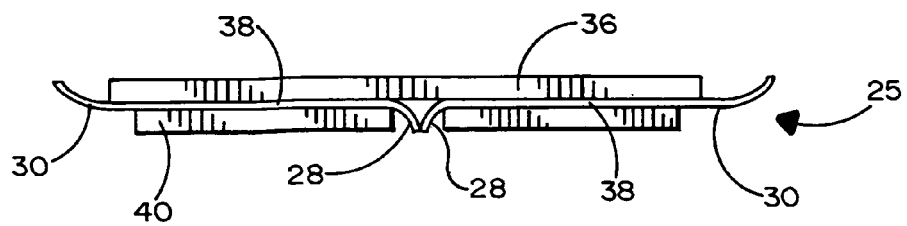

FIG. 5b of the drawings is an end view of the interposer 25 of FIG. 5a showing the opposite curvature of the inner and outer microspring contacts 28 and 30 relative to the conductive traces 38 that extend therebetween and fan out across the substrate 36 to opposite sides of the IC device 3 of FIG. 4. Although the conductive traces 38 are disposed between the substrate 36 and the passivation layer 40, the passivation layer 40 is formed so that the inner and outer microspring contacts 28 and 30 are exposed in order to be appropriately bonded in the manner shown in FIG. 4.

We claim:

1. A semiconductor leadframe package comprising an encapsulated body, said encapsulated body including therewithin an integrated circuit chip, a plurality of bonding pads attached to the integrated circuit chip, a set of conductive traces lying on a surface of said integrated circuit chip and connected to respective ones of the bonding pads, said conductive traces fanning outwardly from respective ones of said plurality of bonding pads over said integrated circuit chip, a leadframe overhanging the set of conductive traces and said integrated circuit chip within said encapsulated body and having a plurality of leads extending to a location at the exterior of said body, and electrically conductive bumps connected between the set of conductive traces on the surface of said integrated circuit chip and the leadframe at a location where said leadframe overhangs said conductive traces and said integrated circuit chip within said encapsulated body by which each of said plurality of leads of the leadframe is electrically connected directly to a respective one of the plurality of bonding pads by way of an electrical series connection of a corresponding conductive trace of said set of conductive traces and an electrically conductive bump and without any wire bonding connections wherein said encapsulated body includes a redistribution layer located on a surface of said integrated circuit chip, said redistribution layer having formed thereon said set of conductive traces and an array of trace terminal bump pads communicating with said set of traces, said trace terminal bump pads establishing terminals at the location where said leadframe overhangs said conductive traces and said integrated circuit chip at which said electrically conductive bumps are located so as to be connected between respective ones of said set of conductive traces and said leadframe.

2. The semiconductor leadframe package recited in claim 1, wherein said electrically conductive bumps are flip-chip bonded to the surface of said integrated circuit chip during the manufacture of said chip.

3. The semiconductor leadframe package recited in claim 1, wherein said electrically conductive bumps are fabricated from solder.

4. The semiconductor leadframe package recited in claim 3, wherein said electrically conductive solder bumps are connected to said leadframe within said encapsulated body by means of oven reflow.

5. The semiconductor leadframe package recited in claim 3, wherein said electrically conductive solder bumps are connected to said leadframe within said encapsulated body by means of compression and heat cure.

6. The semiconductor leadframe package recited in claim 1, wherein said electrically conductive bumps are fabricated from an electrically conductive material selected from a set of electrically conductive materials comprising gold, nickel/gold and conductive polymer.

7. The semiconductor leadframe package recited in claim 1, wherein said leadframe extending to the exterior of said encapsulated body includes tips that are bent into a gull-wing shape, whereby said package is a thin small outline package.

8. The semiconductor leadframe package recited in claim 1, wherein said leadframe extending to the exterior of said encapsulated body includes tips that are wrapped under said body, whereby said package is a micro-leadframe package.

9. The semiconductor leadframe package recited in claim 1, wherein said encapsulated body includes a plurality of said electrically conductive bumps by which to connect each trace of said set of conductive traces to said leadframe within said body.

10. A semiconductor leadframe package comprising an encapsulated body, said encapsulated body including therewithin an integrated circuit chip, a plurality of bonding pads attached to the integrated circuit chip, a set of conductive traces connected to and fanning outwardly from respective ones of the bonding pads, a leadframe overhanging and being electrically connected to the set of conductive traces within said body and extending to a location at the exterior of said body, an interposer comprising an insulating substrate located between said leadframe and said set of conductive traces such that said leadframe lies on a first surface of said insulating substrate and said set of conductive traces lie on an opposite surface of said insulating substrate, first contacts connected to each of said set of conductive traces to connect first ends of respective ones of the set of conductive traces directly to corresponding ones of the plurality of bonding pads without wire bonding connections, and second contacts connected to each of said set of conductive traces to connect opposite ends of the set of conductive traces to the leadframe wherein the second contacts connected to each of said set of conductive traces extend beyond the insulating substrate on which said set of conductive traces are formed by means of which respective ones of said set of conductive traces are connected directly to said leadframe without intermediate bonding connections.

11. The semiconductor leadframe package recited in claim 10, wherein the substrate of said interposer is manufactured from a flexible material.

12. The semiconductor leadframe package recited in claim 10, wherein said first and second contacts are flexible microsprings having a spring memory.

13. The semiconductor leadframe package recited in claim 12, wherein said first and second microspring contacts are curved.

14. The semiconductor leadframe package recited in claim 13, wherein the first and second microspring contacts are curved in opposite directions relative to one another.

15. The semiconductor leadframe package recited in claim 10, wherein said set of conductive traces are disposed within said encapsulated body so as to lie between the insulating substrate of said interposer and said plurality of bonding pads.

16. A semiconductor leadframe package comprising an encapsulated body, said encapsulated body including therewithin an integrated circuit chip, a plurality of bonding pads attached to the integrated circuit chip, an insulating substrate, a leadframe located at one side of said insulating substrate, a set of conductive traces located at the opposite side of said insulating substrate and fanning thereacross, first contacts comprising first curved microsprings located at first ends of respective ones of said set of conductive traces for electrical connection to said leadframe at the interior of the encapsulated body and second contacts comprising second curved microsprings located at opposite ends of respective ones of said set of conductive traces for electrical connection to corresponding ones of the plurality of bonding pads, whereby said leadframe is connected to said plurality of bonding pads by way of said set of conductive traces and without any wire bonding connections, said leadframe overhanging said insulating substrate and the set of conductive traces located at the opposite side of said insulating substrate at the interior of the encapsulated body and said leadframe extending to the exterior of the encapsulated body.

* * * * *